(12) United States Patent
Imai (10) Patent No.: US 8,056,746 B2
(45) Date of Patent: Nov. 15, 2011

(54) SYNTHETIC RESIN BOTTLE

(75) Inventor: Toshio Imai, Tokyo (JP)

(73) Assignee: Yoshino Kogyosho Co., Ltd., Tokyo (JP)

( * ) Notice: Subject to any disclaimer, the term of this patent is extended or adjusted under 35 U.S.C. 154(b) by 0 days.

(21) Appl. No.: 12/310,163

(22) PCT Filed: Aug. 20, 2007

(86) PCT No.: PCT/JP2007/066130
§ 371 (c)(1),
(2), (4) Date: Mar. 2, 2009

(87) PCT Pub. No.: WO2008/026469
PCT Pub. Date: Mar. 6, 2008

(65) Prior Publication Data
US 2009/0277864 A1 Nov. 12, 2009

(30) Foreign Application Priority Data
Aug. 28, 2006 (JP) .................................. 2006-230535

(51) Int. Cl.
*B65D 1/02* (2006.01)
(52) U.S. Cl. ...... 215/382; 215/379; 220/669; 220/62.11
(58) Field of Classification Search .................. 215/382, 215/379; 220/669, 62.11
See application file for complete search history.

(56) References Cited

U.S. PATENT DOCUMENTS
2002/0127333 A1 9/2002 Slat
2002/0176947 A1 * 11/2002 Darras et al. ................. 427/569

FOREIGN PATENT DOCUMENTS
| JP | A-2002-53119 | 2/2002 |
| JP | A-2003-237754 | 8/2003 |
| JP | A-2006-160269 | 6/2006 |
| WO | WO 01/10725 A1 | 2/2001 |
| WO | WO 03/053801 A1 | 7/2003 |

OTHER PUBLICATIONS

European Search Report issued in corresponding European Application No. 07792743.2, mailed Dec. 8, 2009.
Jul. 26, 2011 Office Action issued in Japanese Patent Application No. 2006-230535 (with translation).

* cited by examiner

Primary Examiner — Anthony Stashick
Assistant Examiner — Cynthia F Collado
(74) Attorney, Agent, or Firm — Oliff & Berridge, PLC (57) ABSTRACT

There is provided a synthetic resin bottle in which an amorphous carbon film having good appearance without forming the brown mottled pattern on the surface thereof is deposited. The present invention provides a bottle having a mouth portion, a shoulder portion, a body portion and a bottom portion in which an amorphous carbon film is deposited on the inner surfaces of the mouth portion, the shoulder portion, the body portion and the bottom portion by supplying C2H2 gas. When the height position of the shoulder portion in the direction toward the mouth portion along the bottle axis from the position at which the inner diameter of the shoulder portion is maximal is within the area whose height is not more than 70% the total height of the shoulder portion along the bottle axis, the amorphous carbon film on the shoulder portion within the above range of height position is formed so that the thickness thereof is not less than 0.9 times but not more than 1.1 times the thickness at the shoulder portion having maximum inner diameter.

5 Claims, 6 Drawing Sheets

SYNTHETIC RESIN BOTTLE

TECHNICAL FIELD

The present invention relates to a synthetic resin bottle having a mouth portion, a shoulder portion, a body portion and a bottom portion in which an amorphous carbon film, which is excellent in barrier properties against gas such as oxygen gas, carbon dioxide gas or the like, is deposited on at least inner surfaces of the shoulder portion, the body portion and the bottom portion.

RELATED ART

As a synthetic resin bottle represented typically by a PET bottle, known is a bottle having an amorphous carbon film deposited on the inner surface thereof to improve gas barrier properties.

However, there is a problem that when such amorphous carbon film is deposited and the film gets thicker, the thickened portions turn brown and thus the appearance of the bottle is deteriorated. When the inside of the bottle mouth portion turns brown, in particular, the commercial value of products can be reduced although there is no problem with the quality.

In order to solve this problem, a conventional bottle produced by the following manner has been proposed: a cylindrical member (masking means) is inserted into an extraction path formed in the mouth portion of the bottle; after the cylindrical member is positioned in the extraction path, in addition, raw material gas containing carbon is supplied through the cylindrical member to a filling space of contents formed by inner surfaces of the shoulder portion connected to the mouth portion, the body portion and the bottom portion so that an amorphous carbon film is deposited on the inner surface of the bottle except for the extraction path portion by chemical vapor deposition represented by plasma-enhanced CVD (see, for example, JP2002-53119 A).

DISCLOSURE OF THE INVENTION

Even in such conventional bottle in which an amorphous carbon film is deposited on areas except for the extraction path portion, however, a thick amorphous carbon film is formed on the area from which the inner diameter of the bottle begins to expand toward the shoulder portion from the mouth portion and on the area adjacent thereto and thus a brown mottled pattern may be formed on those areas.

The brown mottled pattern in such areas can be generated on a bottle shoulder portion (transparent portion) positioned lower than a mouth portion whitening-treated by thermal crystallization. Therefore, customers may recognize the pattern from the outside of the bottle. That is, it has sometimes happened that the brown mottled pattern was formed on the inside of even a conventional synthetic resin bottle, which deteriorated the commercial value of products.

It is therefore an object to be achieved by the present invention, which is based on the recognition of such fact, to provide a synthetic resin bottle in which an amorphous carbon film having good appearance is deposited inside the bottle without forming the brown mottled pattern.

The present invention provides a synthetic resin bottle having a mouth portion, a shoulder portion, a body portion and a bottom portion in which an amorphous carbon film is deposited on at least inner surfaces of the shoulder portion, the body portion and the bottom portion, wherein the amorphous carbon film on the mouth portion and the shoulder portion is deposited so that the thickness thereof is not more than 1.8 times the thickness at the position at which the inner diameter of the shoulder portion is maximal.

In the invention, in a region where the height position of the shoulder portion in the direction toward the mouth portion along the bottle axis from the position at which the inner diameter of the shoulder portion is maximal is within the area having a height not more than 70% the total height of the shoulder portion along the bottle axis, it is preferable that the amorphous carbon film on the shoulder portion within the above range of height position is formed so that the thickness thereof is not more than 1.2 times the thickness at the position at which the inner diameter of the shoulder portion is maximal.

In the invention, furthermore, it is preferable that the thickness of the amorphous carbon film formed on the shoulder portion within the above range of height position is not less than 0.9 times but not more than 1.1 times the thickness at the position at which the inner diameter of the shoulder portion is maximal.

According to the invention, for example, even when an amorphous carbon film is deposited inside the bottle by chemical vapor deposition with supplying raw material gas containing carbon into the filling space of the synthetic resin bottle, the brown mottled pattern is not formed on the area from which the inner diameter of the bottle begins to expand toward the shoulder portion from the mouth portion and on the vicinity thereof, and especially on the shoulder portion of the bottle. According to the invention, therefore, the bottle having good appearance and thus high commercial value can be obtained while improving the barrier properties by forming the amorphous carbon film.

| REFERENCE SYMBOLS | |
|---|---|
| 1 | PET bottle (synthetic resin bottle) |
| 2 | mouth portion |
| 3 | shoulder portion |
| 4 | body portion |
| 5 | bottom portion |
| 6 | extraction path |
| 7 | amorphous carbon film |
| 10 | film deposition system |
| 11 | enclosed mold |
| 11a | bottom mold |
| 11b | body mold |
| 11c | adoral mold |
| 11d | hollow mold |

-continued

REFERENCE SYMBOLS

| 11e | roof mold |
|---|---|
| 12 | cylindrical member |
| 12p | passage |
| 13 | fitting frame |
| 14 | vent pipe |
| 15 | gas supply pipe |
| $f_1$ | inner surface of extraction path |
| $f_2$ | mouth ramp |
| $f_3$ | shoulder inner surface |
| $f_4$ | body inner surface |
| $f_5$ | bottom inner surface |
| $T_1$ | film (inner surface of extraction path) |
| $T_2$ | film (mouth ramp) |
| $T_3$ | film (shoulder inner surface) |
| $T_4$ | film (body inner surface) |
| $T_5$ | film (bottom inner surface) |
| R | filling space |

BEST MODE FOR CARRYING OUT THE INVENTION

The synthetic resin bottle of the invention will be described in detail with reference to the accompanying drawings.

Figure 1:
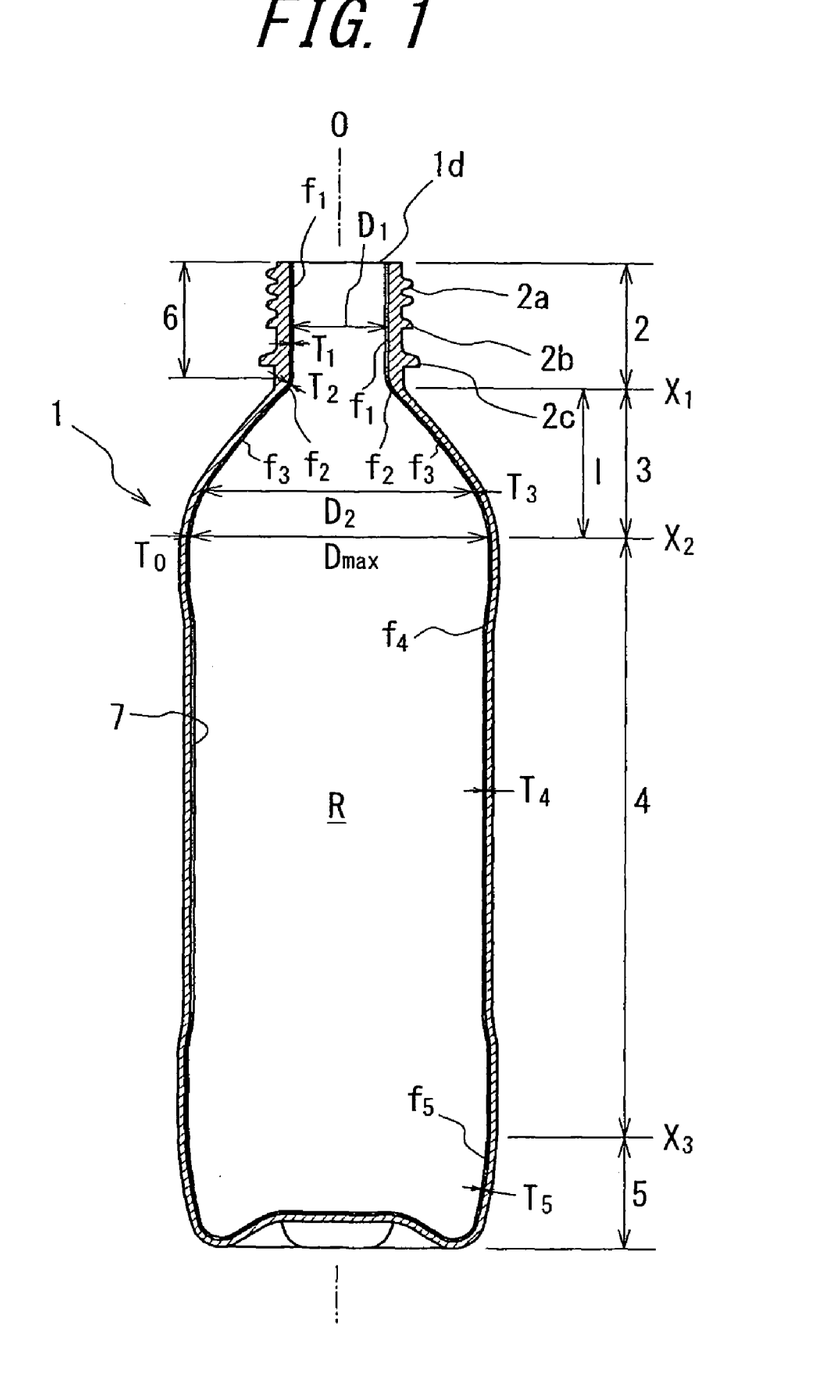
FIG. 1 is a schematic cross-sectional view exemplifying a bottle according to the invention.
Figure 2:
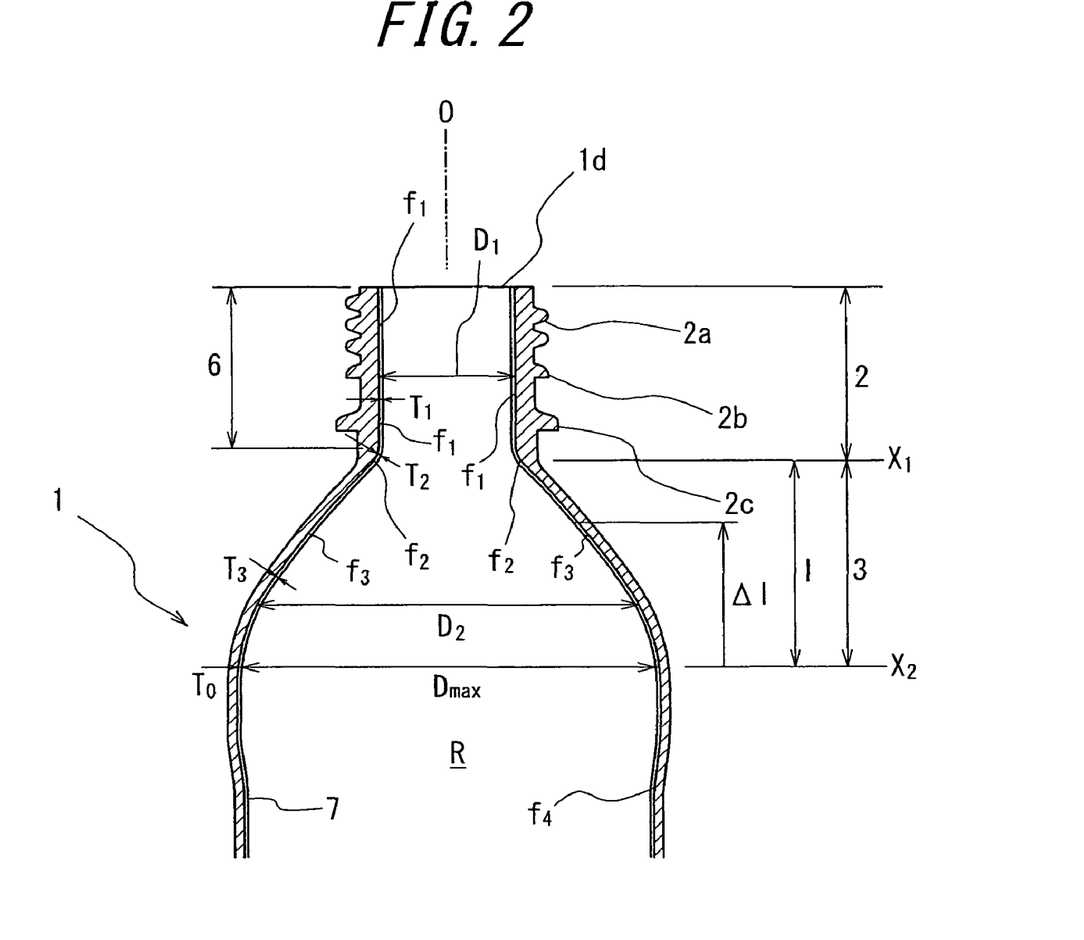
FIG. 2 is an enlarged cross-sectional view of a main portion from the mouth portion to the body portion of the bottle.

FIG. 1 is a schematic cross-sectional view exemplifying a bottle 1 according to the invention and FIG. 2 is an enlarged cross-sectional view of a main portion from the mouth portion 2 to the body portion 4 of the bottle 1.

A bottle 1 is formed by biaxially stretch-blow molding a preform (not shown) made of PET (polyethylene terephthalate) resin and has an outer profile in which a mouth portion 2, a shoulder portion 3, a body portion 4 and a bottom portion 5 are integrally connected as shown in FIG. 1.

In the bottle 1, the peripheral part of the mouth portion 2 has a threaded portion 2a for screwing a cap (not shown), an annular bead portion 2b for controlling the screw depth of the cap and an annular neck ring 2c for carrying the bottle.

On the other hand, the inside of the mouth portion 2 is formed of an inner surface $f_1$ forming an extraction path 6 having a substantially-constant inner diameter D1 and an annular ramp $f_2$ being connected to the inner surface $f_1$ and expanding radially outward from a bottle axis O toward the bottom portion 5. The ramp $f_2$ is connected to a shoulder 3 inner surface $f_3$. Therefore, the extraction path 6 connects a filling space R of contents formed by the shoulder 3 inner surface $f_3$, the body 4 inner surface $f_4$ and the bottom 5 inner surface $f_5$, to the outside.

It is noted that in the bottle 1 the shoulder portion 3 includes from the position $X_1$ corresponding to the end of the mouth 2 ramp $f_2$ from which the inner diameter $D_2$ of the shoulder portion 3 begins to expand toward the body portion 4, to the position $X_2$ at which the inner diameter $D_2$ is maximal ($D_2=D_{max}$) (hereafter referred to as "the shoulder portion having maximum inner diameter"). Similarly, the body portion 4 includes from the shoulder portion having maximum inner diameter $X_2$ at which the inner diameter $D_2$ of the shoulder portion 3 is maximal ($D_2=D_{max}$), via a portion recessed annularly around the bottle axis O and then a portion at which the inner diameter is the maximal again, to the position $X_3$ corresponding to the upper end of the ramp $f_5$ from which the diameter begins to reduce. The bottom portion 5 includes from the position $X_3$ connected to the body portion 4 to a ground contact.

An amorphous carbon film 7 is deposited on the inside of the bottle 1, as shown in FIG. 1. The amorphous carbon film 7 is formed on the inner surface including of the mouth portion 2, and the amorphous carbon film 7 on the mouth portion 2 and the shoulder portion 3 is formed so that the thickness thereof is not more than 1.8 times the thickness $T_o$ at the shoulder portion having maximum inner diameter $X_2$.

When the height of the shoulder portion 3 along the bottle axis O is denoted by 1, as shown in FIG. 2 and the height position Δ1 of the shoulder portion 3 in the direction toward the mouth portion 2 along the bottle axis O from the shoulder portion having maximum inner diameter $X_2$ is within the area whose height is not more than 70% the height 1 of the shoulder portion (0≦Δ1≦0.70×1), it is preferable that the amorphous carbon film 7 on the shoulder portion 3 within the above range of height position (0≦Δ1≦0.70×1) is formed so that the thickness thereof is not more than 1.2 times the thickness $T_0$ at the shoulder portion having maximum inner diameter $X_2$.

It is more preferable that when the height position Δ1 of the shoulder portion 3 is within the area whose height is not more than 70% the total height 1 of the shoulder portion (0≦Δ1≦0.70×1) the thickness $T_3$ of the amorphous carbon film 7 formed on the shoulder 3 inner surface $f_3$ is not less than 0.9 times but not more than 1.1 times the thickness $T_0$ at the shoulder portion having maximum inner diameter $X_2$.

According to the embodiment, for example, even when the amorphous carbon film 7 is deposited inside the bottle 1 by chemical vapor deposition with supplying raw material gas containing carbon into the filling space R of the bottle 1, the brown mottled pattern is not formed on $X_1$ from which the inner diameter of the bottle 1 begins to expand toward the shoulder portion 3 from the mouth portion 2 and on the vicinity thereof, and especially on the shoulder portion 3. Therefore, the bottle 1 having good appearance and thus high commercial value can be obtained while improving the barrier properties by forming the amorphous carbon film 7. Moreover, no mottled pattern is generated on the inner surface $f_1$ of the mouth portion 2.

Figure 3:
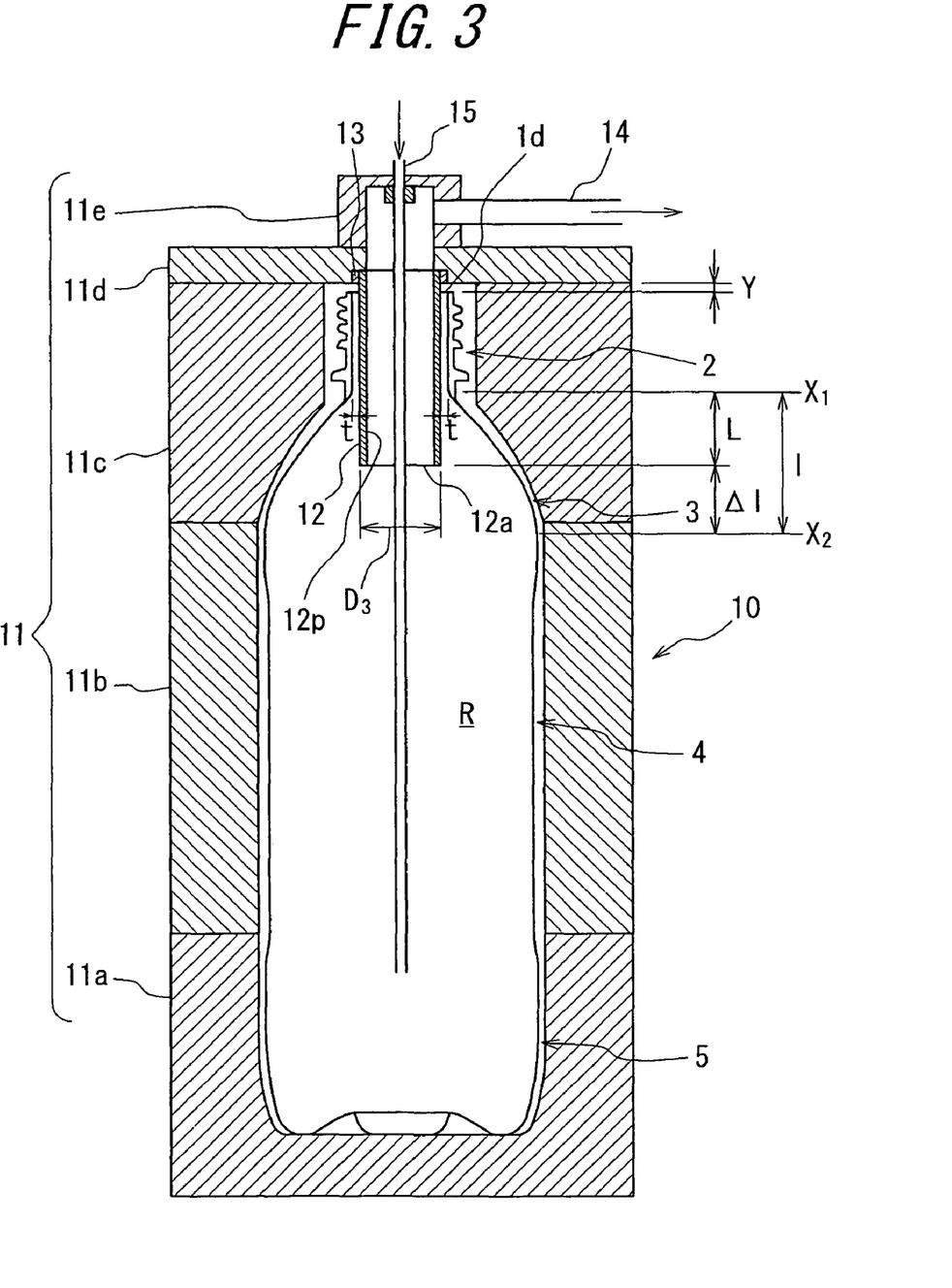
FIG. 3 is a schematic cross-sectional view of a system for depositing an amorphous carbon film inside a film-unformed bottle, shown with such bottle.

FIG. 3 is a schematic cross-sectional view of a system 10 for forming a film inside a bottle, together with a bottle prior to the film deposition.

The film deposition system 10 is equipped with an enclosed mold 11 surrounding the bottle 1 hermetically, as shown in FIG. 3. The enclosed mold 11 is formed of five molds of a bottom mold 11a, a body mold 11b, an adoral mold 11c, a hollow mold 11d and a roof mold 11e and serves as an external electrode for creating plasma in plasma-enhanced CVD.

The hollow mold 11d, in particular, is spaced upward from a top portion 1d of the mouth portion 2 by height Y and equipped with a cylindrical member 12 which is inserted and positioned in the extraction path 6 of the bottle 1.

The cylindrical member 12 has an outer diameter $D_2$ which is smaller than the inner diameter $D_1$ of the extraction path 6 by length 2t. The total length of the cylindrical member 12 is arranged so that its end 12a projects by length (effective insertion depth) L from the extraction path 6 when the bottle 1 is set in the enclosed mold 11.

The total length of the cylindrical member 12 can be arranged so that its end 12a reaches areas defined as the body portion 4 or the bottom portion 5 when the bottle 1 is set in the enclosed mold 11. In view of the flow of raw material gas in the filling space R, however, it is preferable that the end 12a is kept within an area defined as the shoulder portion 3 when the bottle 1 is set in the enclosed mold 11, as shown in FIG. 3.

When the height of the shoulder portion 3 along the bottle axis O is shown as 1, as shown in FIG. 3 and the height position, in the direction toward the mouth portion 2 from the shoulder portion having maximum inner diameter $X_2$, of the end 12a of the cylindrical member 12 when inserted into the bottle 1 is shown as Δ1, the end 12a of the cylindrical member 12 is positioned preferably within the area whose height is not more than 72% the total height 1 of the shoulder portion from the shoulder portion having maximum inner diameter $X_2$ (0≦Δ1≦0.72×1) and more preferably within the area whose height is not more than 41% the total height 1 of the shoulder portion from the shoulder portion having maximum inner diameter $X_2$ (0≦Δ1≦0.41×1).

It is noted that the cylindrical member 12 is removably attached to the hollow mold 11d with an annular fitting frame 13. Therefore, the cylindrical member 12 can be changed appropriately according to properties required for the bottle 1.

A reference symbol 11e designates a roof mold being joined to the hollow mold 11d and sealing areas inside of the molds 11a-11d. A vent pipe 14 connected to an aspirator such as a vacuum pump or the like and a gas supply pipe 15 supplying raw material gas into the filling space R are attached to the roof mold 11e. The gas supply pipe 15 serves as an internal electrode for generating plasma in plasma-enhanced CVD.

Next, one example of methods for depositing an amorphous carbon film on a film-unformed bottle will be described in detail with reference to FIG. 3.

First of all, a film-unformed bottle is set in the enclosed mold 11. Thereby, the cylindrical member 12 is inserted so as automatically to form a gap t from the inner surface $f_1$ of the extraction path 6 and also positioned so that its end 12a automatically projects from the extraction path 6 into the filling space R by effective insertion depth L.

Subsequently, an aspirator such as a vacuum pump connected to the vent pipe 14 is operated, and, as a result, the undeposited bottle is positioned in the evacuated enclosed-mold 11 in a substantially vacuum state.

Subsequently, raw material gas such as acethylene ($C_2H_2$) gas is supplied to the filling space R of the undeposited bottle through the gas supply pipe 15 while the enclosed mold 11 is kept in an evacuated condition. It is noted that the supply with raw material gas can be conducted efficiently after the enclosed mold 11 has been evacuated. However, the supply may be started at the same time as evacuation from the vent pipe 14.

After the predetermined amount of raw material gas is supplied, the raw material gas supplied in the filling space R is brought into the plasma state by energy such as high frequency, microwave or the like. Therefore, the raw materials brought into the plasma state are deposited on the inner surfaces $f_3$, $f_4$ and $f_5$ of the shoulder portion 3, the body portion 4 and the bottom portion 5, so that an amorphous carbon film is formed. It is preferable that, in view of depositing the film securely, the raw materials are brought into the plasma state under the condition that evacuation from the vent pipe 14 and supply with the raw material gas from the gas supply pipe 15 are continued.

Figure 4:
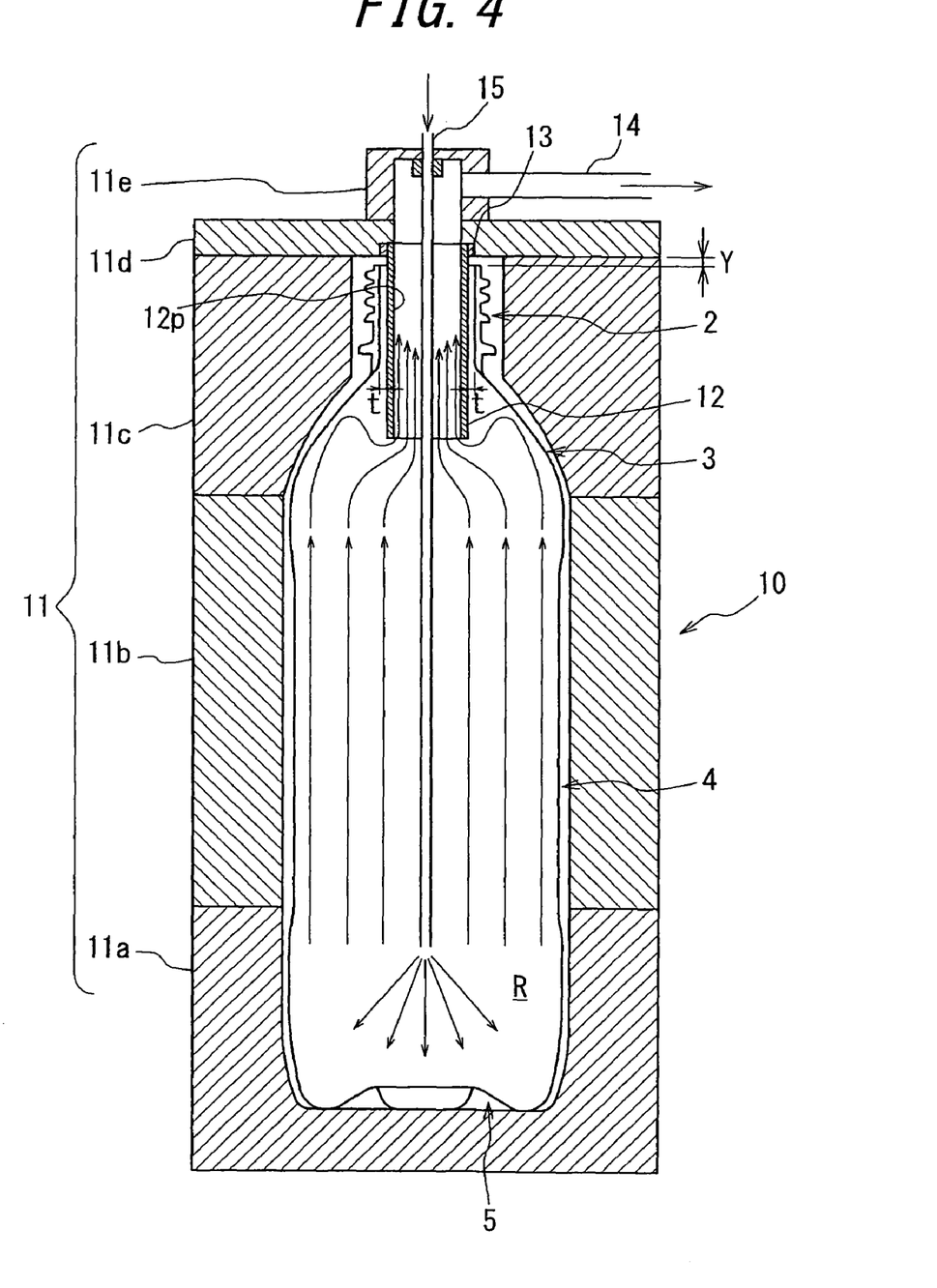
FIG. 4 is a schematic cross-sectional view showing, in the system, the laminar flow of plasma in the filling space of the film-unformed bottle.
Figure 5:
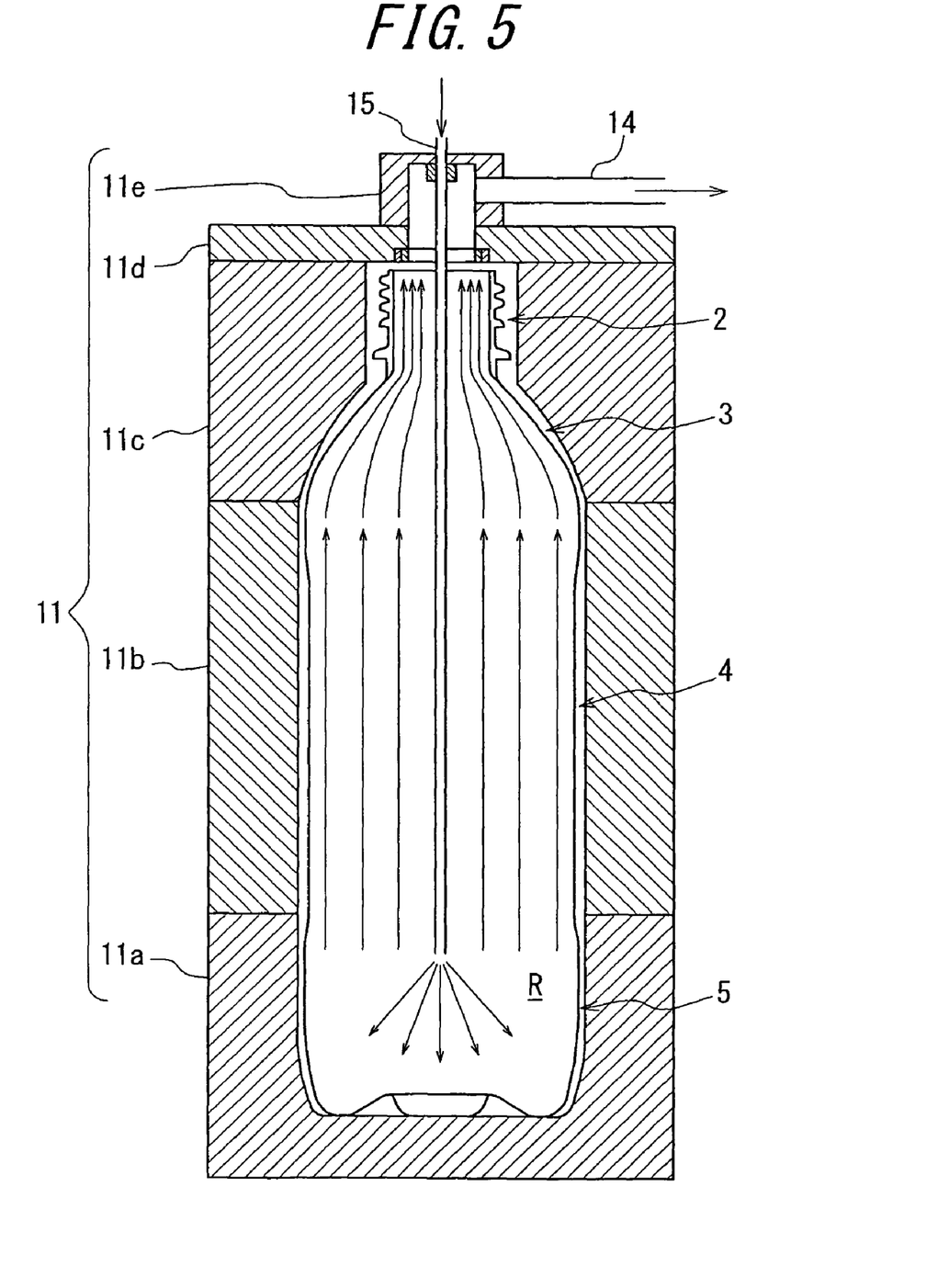
FIG. 5 is a schematic cross-sectional view showing the laminar flow of raw materials brought into the plasma state in the filling space of the bottle in a conventional method for forming a film without use of a cylindrical member.

FIG. 4 is a schematic cross-sectional view showing the laminar flow of raw material gas in the filling space R in the above method for depositing an amorphous carbon film. FIG. 5 is a schematic cross-sectional view showing the laminar flow of raw material gas in the filling space in a conventional method for depositing an amorphous carbon film without use of the cylindrical member 12.

In chemical vapor deposition such as plasma-enhanced CVD, evacuation from the vent pipe 14 and supply with the raw material gas from the gas supply pipe 15 are usually continued under the condition that high frequency wave, microwave or the like is applied during the deposition of a film. Therefore, the raw material gas supplied to the filling space R flows from the end of the gas supply pipe 15 into the bottom portion 5, the body portion 4 and the shoulder portion 3 sequentially.

In the method for depositing a film without use of the cylindrical member 12, therefore, the concentration of raw material gas becomes higher as the diameter of the bottle tapers toward the mouth portion 2 from the shoulder portion 3, as shown in FIG. 5. Then, it is supposed that the thickness of the film increases around the inner surface $f_1$ of the extraction path and the ramp $f_2$ in the mouth portion 2, resulting in the formation of the brown mottled pattern.

In the above method for depositing a film with use of the cylindrical member 12, on the other hand, raw material gas flowing along the vicinity of the bottle axis O from the gas supply pipe 15 flows directly into the passage 12p formed in the cylindrical member 12 and is evacuated therefrom, while raw material gas flowing along the shoulder 3 inner surface $f_3$ flows circuitously into the passage 12p formed in the cylindrical member 12 and is evacuated therefrom, as shown in FIG. 4.

In the above method for depositing a film with use of the cylindrical member 12, therefore, raw material gas reaching the ramp $f_2$ connected to the extraction path 6 and the vicinity $f_1$ and $f_3$ of the ramp $f_2$ decreases, and thus it is supposed that no brown mottled pattern is formed on the area from which the inner diameter of the film-unformed bottle begins to expand toward the shoulder portion 3 from the mouth portion 2, i.e. on the ramp $f_2$ and the vicinity $f_1$ and $f_3$ thereof even when an amorphous carbon film is deposited inside the undeposited bottle by plasma-enhanced CVD.

In the above method for forming a film with use of the cylindrical member 12, furthermore, the cylindrical member 12 is positioned so that raw material gas supplied in the filling space R is evacuated from a gap Y between the top portion 1d and the hollow mold 11d after flowing through a gap t as shown FIGS. 3 and 4, and thus a part of raw material gas flowing along the shoulder 3 inner surface $f_3$ is also evacuated into the enclosed mold 11 through the gap t without convecting between the shoulder portion 3 and the cylindrical member 12. Therefore, it is supposed to be more effective that the cylindrical member 12 is positioned so that raw material gas supplied in the filling space R is evacuated through t since a film can be formed on the inner surface $f_1$ and the mouth ramp $f_2$ in the mouth portion 2 and since the formation of the brown mottled pattern is prevented as well, as in the bottle 1.

Although the present invention has been described above with reference to the best mode, it is apparent for a person skilled in the art that various modifications may be made without departing from the scope of the appended claims. For example, alkanes, alkenes, alkynes or the mixture thereof as well as $C_2H_2$ gas can be used as raw material. Moreover, as a CVD method, heat CVD in which gas containing the above raw materials is bought into the radical state by heat energy for deposition or photo CVD in which gas containing the above raw materials is bought into the radical state by light energy for deposition may be cited by way of example. Furthermore, the bottle shape is not limited to cylindrical and may be polygonal.

EMBODIMENT 1

In the next, the properties of the bottle of the invention and a conventional bottle were compared for 500 ml PET bottles for carbonated drinks.

PET bottles each having a petaloid bottom as shown in FIG. 1 and a amorphous mouth portion which was not subjected to whitening (crystallization) were used.

Using a high-frequency film deposition system and acetylene gas as raw material gas, an amorphous carbon film was deposited on the above PET bottles under conditions of the flow: 120 sccm, the pressure: 0.145 Torr, the RF output: 800W and time length for forming a film (DEPO TIME): 1.0 sec.

A nozzle having an annular cross section was used as a cylindrical member. The difference between the outer diameter $D_3$ of the nozzle and the inner diameter $D1$ of the extraction path 6 in FIG. 1 is 4.6 mm, and the width of gap t between the outer surface of the nozzle and the inner surface $f_1$ of the extraction path 6 is about 2.3 mm when the nozzle is positioned in the PET bottle.

For evaluation of properties, the depth of nozzle insertion into PET bottle was changed in four levels and each was regarded as sample 1 to 4. It is noted that "nozzle insertion length" in the following Table 1 shows a length of a cylindrical member actually inserted into PET bottle from the top portion of the PET bottle (a portion corresponding to the symbol reference 1d in FIG. 1). In addition, "effective insertion depth" shows the length L of a part projecting from the extraction path 6 in FIG. 3, as described above.

TABLE 1

|  | Sample 1 | Sample 2 | Sample 3 | Sample 4 |
|---|---|---|---|---|
| Nozzle insertion length (mm) | 65 | 50 | 35 | 20 |
| Effective insertion depth (mm) | 49.7 | 29.6 | 14.2 | −0.8 |

Each sample 1-3 in the above table was a nozzle sample used for depositing a film on the bottle of the embodiment 1-3 of the invention, respectively. The nozzle sample 1 was inserted until its end reached the vicinity of the shoulder portion having maximum inner diameter $X_2$. Moreover, the nozzle sample 2 was inserted until its end reached the position at which the height position $\Delta 1$ from the shoulder portion having maximum inner diameter $X_2$ corresponded to a height position about ⅓ of the total height 1 of the shoulder portion 3. Similarly, the nozzle sample 3 was inserted until its end reached the position at which the height position $\Delta 1$ from the shoulder portion having maximum inner diameter $X_2$ corresponded to a height position about ⅔ of the total height 1 of the shoulder portion 3.

On the other hand, sample 4 was a nozzle sample used for forming a film on a conventional bottle of the comparative example. The nozzle sample 4 was inserted until its end reaches a neck ring, i.e. so that its end is kept within the extraction path 6.

Figure 6:
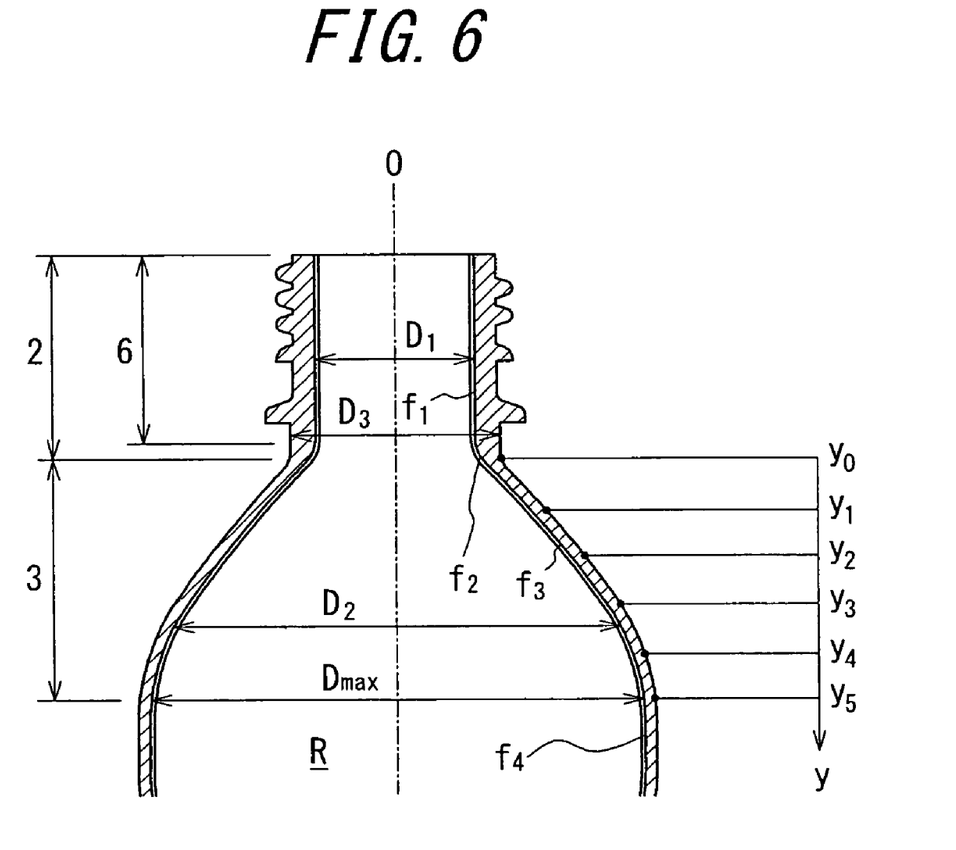
FIG. 6 is an enlarged cross-sectional view of a main portion exemplifying measurement positions of the thickness and color b level of an amorphous carbon film formed on a bottle.

The thickness of the amorphous carbon film formed with use of each sample 1-4 under conditions of Table 1, was measured. The results are shown in the following Table 2. It is noted that in the following table the measurement positions $y_1$-$y_2$ are determined, for convenience, so that the direction toward the bottom portion along the bottle axis O is positive from the connecting position $y_0$ ($y_0$=0 (mm)) between the mouth portion 2 and the shoulder portion 3, as shown in FIG. 6.

TABLE 2

|  |  | Sample 1 | Sample 2 | Sample 3 | Sample 4 |
|---|---|---|---|---|---|
| Shoulder-1 | $y_1$ = 7 (mm) | 5.7 (nm) | 5.7 (nm) | 17.4 (nm) | 137.5 (nm) |
| Shoulder-2 | $y_2$ = 14 (mm) | 18.8 (nm) | 17.1 (nm) | 39.9 (nm) | 53.1 (nm) |
| Shoulder-3 | $y_3$ = 21 (mm) | 18.4 (nm) | 19.2 (nm) | 24.6 (nm) | 30.4 (nm) |
| Shoulder-4 | $y_4$ = 28 (mm) | 18.1 (nm) | 20.3 (nm) | 22.4 (nm) | 20.3 (nm) |
| Shoulder-5 | $y_5$ = 35 (mm) | 18.7 (nm) | 23.1 (nm) | 22.5 (nm) | 20.9 (nm) |

In the embodiments 1-3 in which a film was deposited with use of samples 1-3, as is apparent from the above Table 2, some difference of thickness is observed in the upper shoulder portion close to the extraction path 6 but there is no part being extremely thick enough to form the brown mottled pattern. In the comparative example in which a film was deposited with use of sample 4, on the other hand, there is a part being extremely thick in the vicinity of the extraction path 6.

Considering Table 2, it is apparent to be further effective that the thickness of the film on the whole shoulder portion is almost equally thin over a wide range and thus the occurrence of the brown mottled pattern is prevented especially when the sample 1 or 2 is used.

Subsequently, the color difference (color b level) of bottles having an amorphous carbon film formed by method of each embodiment 1-3 or the comparative example under conditions of Table 1, was measured and the results are shown in the following table. It is noted that the color b level is higher as yellow tinge generated on samples is deeper and that the same is even higher as the yellow tinge progresses into the brown tinge.

TABLE 3

|  |  | Sample 1 | Sample 2 | Sample 3 | Sample 4 |
|---|---|---|---|---|---|
| Shoulder-1 | $y_1$ = 7 (mm) | 3.03 | 2.86 | 3.82 | 9.91 |
| Shoulder-2 | $y_2$ = 14 (mm) | 4.57 | 4.72 | 6.73 | 6.89 |
| Shoulder-3 | $y_3$ = 21 (mm) | 4.42 | 4.72 | 5.67 | 5.76 |
| Shoulder-4 | $y_4$ = 28 (mm) | 4.25 | 4.78 | 4.88 | 4.95 |
| Shoulder-5 | $y_5$ = 35 (mm) | 4.66 | 5.22 | 5.16 | 4.37 |

In the embodiments 1-3, as is apparent from the above Table 3 and similarly to evaluation in Table 2, some difference of the color b level is observed in a part close to the extraction path 6 but there is no part where the color b level is extremely high enough to form the brown mottled pattern. In the comparative example, on the other hand, there is a part where the color b level is extremely high in the vicinity of the extraction path 6.

Considering Table 3, moreover, it is apparent to be further effective, similarly to evaluation in Table 2, that the whole color b level is low and thus the occurrence of the brown mottled pattern by forming an amorphous carbon film is prevented especially in the embodiment 1 or 2.

Furthermore, oxygen transmission rate in the embodiments 1-3 and comparative example are measured under conditions of Table 1. As a result, it is confirmed that the rate is kept at certain value allowing products to be strong enough.

What is claimed is:

1. A synthetic resin bottle comprising:
   a mouth portion having an inner surface;
   a shoulder portion having an inner surface and an inner diameter;
   a body portion having an inner surface; and
   a bottom portion having an inner surface;

wherein:
an amorphous carbon film is deposited on at least the inner surfaces of the shoulder portion, the body portion, the mouth portion and the bottom portion;
the amorphous carbon film on the inner surfaces of the mouth portion and the shoulder portion is deposited so that thickness thereof is not more than 1.8 times a thickness at a position at which the inner diameter of the shoulder portion is maximal; and
the thickness of the amorphous carbon film at a predetermined height position is less than 1.0 times the thickness at the position at which the inner diameter of the shoulder portion is maximal, the predetermined height position being a position where a distance in a direction toward the mouth portion along a bottle axis from a position at which the inner diameter of the shoulder portion is maximal is 80% of the a height of the shoulder portion along the bottle axis.

2. The synthetic resin bottle according to claim 1, wherein in a region where a height position of the shoulder portion in the direction toward the mouth portion along a bottle axis from the position at which the inner diameter of the shoulder portion is maximal is within an area having a range of height not more than 70% the height of the shoulder portion along the bottle axis, the amorphous carbon film on the shoulder portion within the range of height is formed so that the thickness thereof is not more than 1.2 times the thickness at the position at which the inner diameter of the shoulder portion is maximal.

3. The synthetic resin bottle according to claim 2, wherein the thickness of the amorphous carbon film formed on the shoulder portion within the range of height position is not less than 0.9 times but not more than 1.1 times the thickness at the position at which the inner diameter of the shoulder portion is maximal.

4. The synthetic resin bottle according to claim 1, wherein the thickness of the amorphous carbon film at the predetermined height position is less than 0.78 times the thickness at the position at which the inner diameter of the shoulder portion is maximal.

5. The synthetic resin bottle according to claim 1, wherein the thickness of the amorphous carbon film is gradually decreased along a bottle axis from the position at which the inner diameter of the shoulder portion is maximal toward the mouth portion.

* * * * *